(12) United States Patent
Kuenen et al.

(10) Patent No.: US 12,132,485 B2
(45) Date of Patent: Oct. 29, 2024

(54) GLITCH-FREE FREQUENCY TUNING OF RING-OSCILLATORS

(71) Applicant: Qorvo US, Inc., Greensboro, NC (US)

(72) Inventors: Jeroen Cornelis Kuenen, Beuningen (NL); Hendrik Arend Visser, Wijchen (NL); Anton Willem Roodnat, Enspijk (NL); Dan Laurentiu Zupcau, Boca Raton, FL (US)

(73) Assignee: Qorvo US, Inc., Greensboro, NC (US)

( * ) Notice: Subject to any disclaimer, the term of this patent is extended or adjusted under 35 U.S.C. 154(b) by 43 days.

(21) Appl. No.: 18/072,157

(22) Filed: Nov. 30, 2022

(65) Prior Publication Data

US 2023/0179185 A1 Jun. 8, 2023

Related U.S. Application Data

(60) Provisional application No. 63/285,221, filed on Dec. 2, 2021.

(51) Int. Cl.
*H03K 3/03* (2006.01)
*H03K 3/037* (2006.01)

(52) U.S. Cl.
CPC .......... *H03K 3/0322* (2013.01); *H03K 3/037* (2013.01)

(58) Field of Classification Search
CPC .................................................. H03K 3/0322
USPC ............................................................ 331/57
See application file for complete search history.

(56) References Cited

U.S. PATENT DOCUMENTS

| 6,028,488 | A | 2/2000 | Landman et al. |
| 6,252,467 | B1 * | 6/2001 | Yoshimura ........... H03K 3/0322 331/34 |
| 9,401,703 | B1 | 7/2016 | Wang et al. |
| 2010/0134170 | A1 | 6/2010 | Wang |
| 2015/0244354 | A1 | 8/2015 | Parikh |

OTHER PUBLICATIONS

Extended European Search Report for European Patent Application No. 22211210.4, mailed May 3, 2023, 13 pages.

(Continued)

*Primary Examiner* — Joseph Chang
(74) *Attorney, Agent, or Firm* — Withrow & Terranova, P.L.L.C.

(57) ABSTRACT

The present disclosure relates to a ring-oscillator with glitch-free frequency-tuning. The disclosed ring-oscillator at least includes multiple delay stages coupled in series within a ring loop and having a first delay stage, a capacitor bank coupled between an output of the first delay stage and ground, and a timing block configured to receive an output signal of the first delay stage and at least one controlling signal. The at least one controlling signal determines at least one capacitor in the capacitor bank connecting or disconnecting to the ring loop. The timing block is configured to pass or not pass the at least one controlling signal to the capacitor bank based on whether the output signal of the first delay stage meets a certain condition. Therefore, the connection or disconnection of the at least one capacitor does not cause a significant voltage change at the output of the first delay stage.

22 Claims, 8 Drawing Sheets

(56) References Cited

OTHER PUBLICATIONS

Johari, A.H. et al., "0.5 V multi-phase digital controlled oscillator with smooth phase transition circuit," 2010 IEEE Asia Pacific Conference on Circuits and Systems, Dec. 2010, Kuala Lumpur, Malaysia, IEEE, 4 pages.

Meijer, M. et al., "Glitch-free discretely programmable clock generation on chip," 2005 IEEE International Symposium on Circuits and Systems, May 23-26, 2005, Kobe, Japan, IEEE, 4 pages.

Miyazaki, T. et al., "A Performance Prediction of Clock Generation PLLs: A Ring Oscillator Based PLL and an LC Oscillator Based PLL," IEICE Transactions on Electronics, vol. 88, No. 5, Mar. 2005, 8 pages.

Perez-Puigdemont, J. et al., "All-Digital Simple Clock Synthesis Through a Glitch-Free Variable-Length Ring Oscillator," IEEE Transactions on Circuits and Systems II: Express Briefs, vol. 61, No. 2, Feb. 2014, first published Jan. 2014, IEEE, 5 pages.

Robles, R.A. et al., "A 0.6V Programmable Frequency Divider and Digitally Controlled Oscillator for use in a Digital PLL in the Subthreshold Region," 2020 27th IEEE International Conference on Electronics, Circuits and Systems (ICECS), Nov. 23-25, 2020, Glasgow, UK, IEEE, 4 pages.

\* cited by examiner

GLITCH-FREE FREQUENCY TUNING OF RING-OSCILLATORS

RELATED APPLICATIONS

This application claims the benefit of provisional patent application Ser. No. 63/285,221, filed Dec. 2, 2021, the disclosure of which is hereby incorporated herein by reference in its entirety.

FIELD OF THE DISCLOSURE

The present disclosure relates to a ring-oscillator with glitch-free frequency tuning.

BACKGROUND

With the rapid development of wireless communication technologies, more and higher requirements are raised for electronic systems like wireless transceivers, data converters, or digital systems. Oscillators, which play a fundamental role in signal generation, waveform synthesizing, and timers, are essential parts of the electronic systems. For instance, in digital systems, oscillators are responsible for providing the clock that allows circuits in the digital system to perform sequential operations and gives the circuits the ability to precisely set the time of important events.

Figure 1:
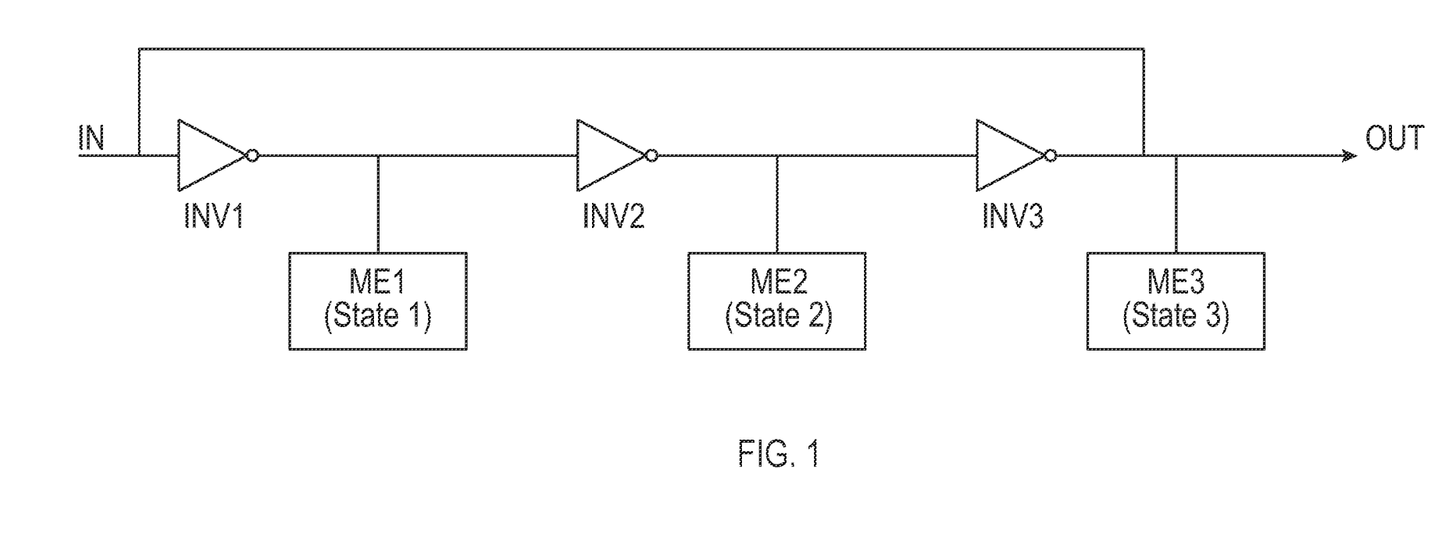
FIG. 1 shows a conventional ring-oscillator.

From area and tuning range perspectives, ring-oscillators are more attractive than inductor-capacitor oscillators. In addition, the ring-oscillators are fully integrable on silicon dies, have a fast startup time, and can provide multi-phase clock signals. FIG. 1 illustrates a conventional structure of a ring-oscillator, which includes multiple inverters (e.g., three inverters INV1, INV2, and INV3) and corresponding memory elements (e.g., three memory elements ME1, ME2, and ME3, respectively). The three inverters are placed in series with an output of the last inverter INV3 being coupled back to an input of the first inverter INV1. There is no stable state, and so the circuit will oscillate. The frequency of oscillation is determined by a total delay in the ring loop. The fact that a delay needs to be made means that each inverter has a "state": memory of how far it is in its delay time. Normally, the memory elements may be implemented with capacitors, but inductors are also possible.

For many applications, like phase-lock-loops (PLLs), it is necessary to tune the frequency of the ring-oscillator. To achieve a precise and reliable performance, an accurate frequency of the output from the ring-oscillator is critical. Glitches at the output, which are additional transitions at the output of the ring-oscillator and have a period time much shorter than an intended period, will significantly affect the performance of the application circuits. It is an object of the present disclosure to provide a ring-oscillator with glitch-free frequency-tuning.

SUMMARY

The present disclosure relates to a ring-oscillator with glitch-free frequency-tuning. The disclosed ring-oscillator at least includes multiple delay stages with a first delay stage, a capacitor bank, and a timing block. The delay stages are coupled in series within a ring loop. The capacitor bank is coupled between an output of the first delay stage and ground. The timing block is configured to receive an output signal of the first delay stage and at least one controlling signal. Herein, the at least one controlling signal determines at least one capacitor in the capacitor bank connecting or disconnecting to the ring loop. When the output signal of the first delay stage meets a certain condition, the timing block is configured to pass the at least one controlling signal to the capacitor bank. When the output signal of the first delay stage does not meet the certain condition, the timing block is configured to latch the at least one controlling signal. As such, the connection or disconnection of the at least one capacitor in the capacitor bank does not cause a voltage at the output of the first delay stage to change beyond a threshold.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

It will be understood that for clear illustrations, FIGS. 1-6B may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Providing a large frequency tuning range is one of the most important features of a ring-oscillator. However, in conventional tuning methods, glitches (i.e., additional pulses) may occur at an output of the ring-oscillator, which makes the ring-oscillator unsuitable for many applications, like for example, clocking digital circuitry.

Figure 2:
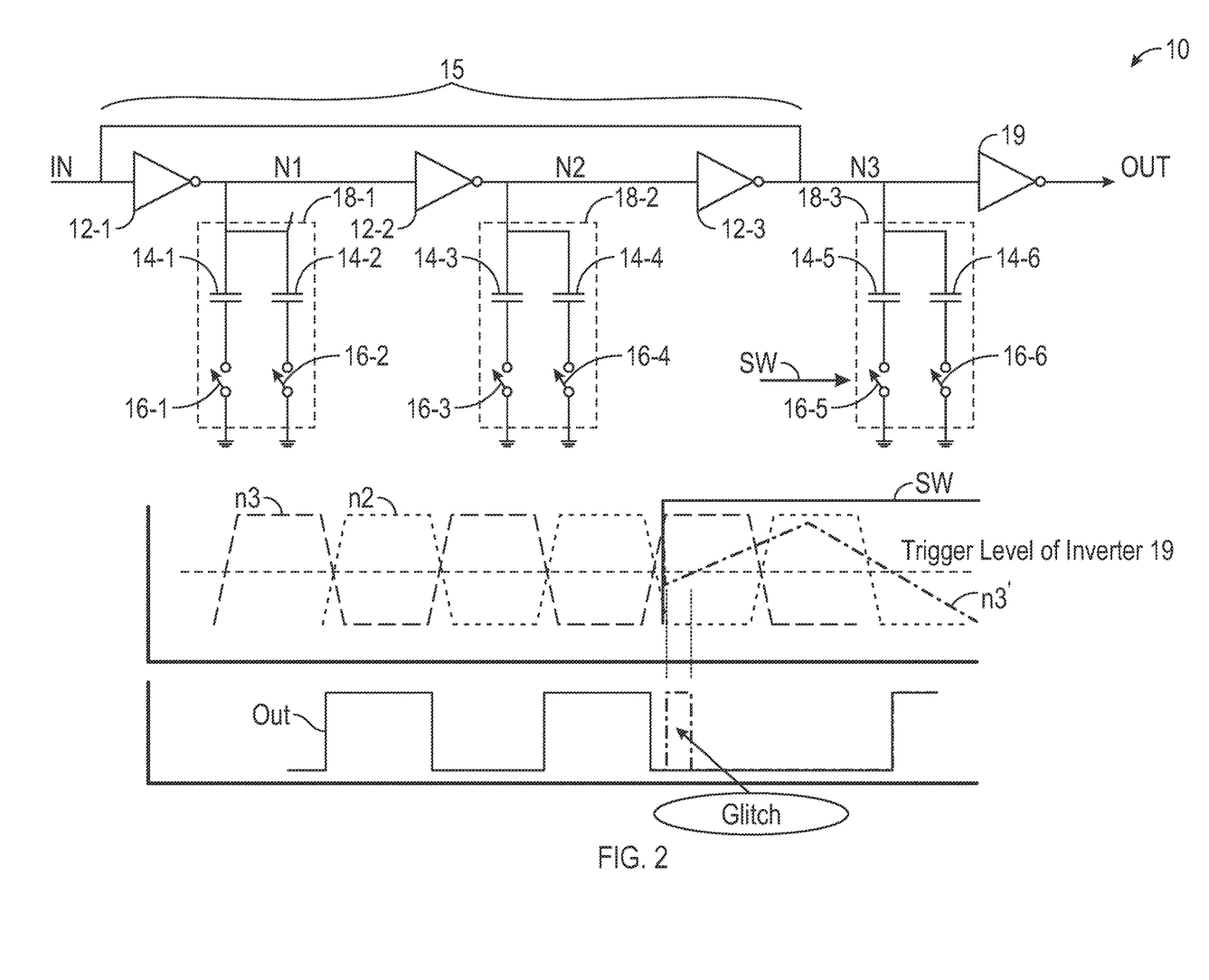
FIG. 2 shows a multistage ring-oscillator with capacitor banks for frequency tuning.

FIG. 2 shows a multistage ring-oscillator 10 with capacitor banks for frequency tuning. The multistage ring-oscillator 10 includes three loop inverters 12 (e.g., a first loop inverter 12-1, a second loop inverter 12-2, and a third loop inverter 12-3) and corresponding capacitors 14 (e.g., a first capacitor 14-1, a second capacitor 14-2, a third capacitor 14-3, a fourth capacitor 14-4, a fifth capacitor 14-5, and a sixth capacitor 14-6). Herein, the three loop inverters 12 are coupled in series within a ring loop 15, where an input IN of the ring-oscillator 10 is an input of the first loop inverter 12-1, an output N1 of the first loop inverter 12-1 is coupled to an input of the second loop inverter 12-2, an output N2 of the second loop inverter 12-2 is coupled to an input of the third loop inverter 12-3, and an output N3 of the third loop inverter 12-3 is coupled back to the input of the first loop inverter 12-1. The first and second capacitors 14-1 and 14-2 are coupled between the output N1 of the first loop inverter 12-1 and ground via a first switch 16-1 and a second switch 16-2, respectively. The first capacitor 14-1, the second capacitor 14-2, the first switch 16-1, and the second switch 16-2 form a first capacitor bank 18-1. The third and fourth capacitors 14-3 and 14-4 are coupled between the output N2 of the second loop inverter 12-2 and ground via a third switch 16-3 and a fourth switch 16-4, respectively. The third capacitor 14-3, the fourth capacitor 14-4, the third switch 16-3, and the fourth switch 16-4 form a second capacitor bank 18-2. The fifth and sixth capacitors 14-5 and 14-6 are coupled between the output N3 of the third loop inverter 12-3 and ground via a fifth switch 16-5 and a sixth switch 16-6, respectively. The fifth capacitor 14-5, the sixth capacitor 14-6, the fifth switch 16-5, and the sixth switch 16-6 form a third capacitor bank 18-3. The first, second, capacitor banks 18-1~18-3 are one possible implementation of the memory elements as shown in FIG. 1. In addition, the multistage ring-oscillator 10 may also include an output inverter 19, where an input of the output inverter 19 is coupled to the output N3 of the third loop inverter 12-3 and an output of the output inverter 19 is an output OUT of the ring-oscillator 10.

By selectively connecting the capacitors 14-1~14-6 (by selectively turning on the switches 16-1~16-6) to the ring loop 15, the frequency at the output OUT of the ring-oscillator 10 can be tuned. The more capacitors that are connected to the ring loop 15, the more the delay and therefore the lower the frequency at the output OUT of the ring-oscillator 10. For some conventional tuning methods, the capacitor connecting may be performed at a random moment in a cycle of the ring-oscillator by a cap controller (not shown). The timing of the capacitor connecting and the signal through the ring-oscillator 10 are asynchronous. If the timing of the capacitor connecting is not chosen accurately, a glitch at the output OUT of the ring-oscillator 10 arises.

As shown in FIG. 2, when the fifth capacitor 14-5 is connected to the ring loop 15 (i.e., the fifth switch 16-5 becomes conducting) at a high signal level of the output N3 of the third loop inverter 12-3, a glitch at the output OUT of the ring-oscillator 10 arises. It is assumed that, initially, none of the capacitors 14 are connected to the ring loop 15, and each switched-off capacitor 14 is discharged to 0V due to leakage of the switches 16. Voltage signals at the output N2 of the second loop inverter 12-2 and at the output N3 of the third loop inverter 12-3 are shown as n2 and n3 respectively. In this example, the fifth capacitor 14-5 is connected to the ring loop 15 by turning on the fifth switch 16-5 to reduce the frequency at the output OUT of the ring-oscillator 10. The moment of closing the fifth switch 16-5 is indicated with a SW line in the graph: when the SW line goes from low to high, the fifth switch 16-5 becomes conducting. Herein, the fifth switch 16-5 becomes conducting (i.e., the SW line goes high) when the n3 signal at the output N3 of the third loop inverter 12-3 is high. At that moment, a charge redistribution takes place at the fifth capacitor 14-5. It is assumed in this example, that all other switches 14 remain off all the time. Due to the charge redistribution, the voltage at the output N3 of the third loop inverter 12-3 drops as shown with a dashed curve n3'.

A square wave Out is provided by the output inverter 19 based on the voltage at the output N3 of the third loop inverter 12-3 (i.e., n3 voltage before the fifth switch 16-5 conducting and n3' voltage after the fifth switch 16-5 conducting). Due to a momentary crossing of the voltage n3' across the trigger level of the output inverter 19, a short pulse is generated at the output of the output inverter 19 (i.e., the output OUT of the ring-oscillator 10). In this example, the short pulse happens shortly after the previous transition pulse: a glitch is born. As such, the output frequency of the ring-oscillator 10 increases but not decreases. If the square wave signal Out would be used as a clock signal for a digital circuit, the timing constraints would be violated, and the digital circuit would be brought in an unknown and possibly unwanted state. Furthermore, a power supply of one ring-oscillator is often done with a single current source to reduce its phase noise. However, when one capacitor is conducting (e.g., the fifth switch 16-5 conducting), while the corresponding capacitor bank (e.g., the third capacitor bank 18-3) is charged, a dip will result on the power supply and affect all loop inverters 12. This makes the effect of turning on one capacitor at an incorrect moment even greater.

In another implementation, if the voltages over the switched-off capacitors 14 are different than 0V, the glitch issue may still exist. When one capacitor 14 is switched on at a random moment in a cycle of the ring-oscillator 10, its voltage may still differ from the voltage at the output of the corresponding loop inverter 12. Therefore, once the capacitor is conducted, the charge redistribution will still happen, and a sudden and significant change in voltage will still occur at the output of the corresponding loop inverter 12, which will lead to the glitch.

Notice that, for the ring-oscillator 10, if the capacitor 14 is connected to or disconnected from the ring loop 15 only when the output voltage of the corresponding loop inverter 12 is at or close to zero volt, there will be no significant charge redistribution to the capacitor 14, and therefore, no significant change in voltage will occur at the output of the corresponding loop inverter 12 (i.e., the change in voltage at the output of the corresponding loop inverter 12 is not exceeding a threshold, such as not beyond the trigger level of the output inverter 19). In consequence, the voltage level at the output OUT of the ring-oscillator 10 will remain the same (i.e., not glitch).

Figure 3:
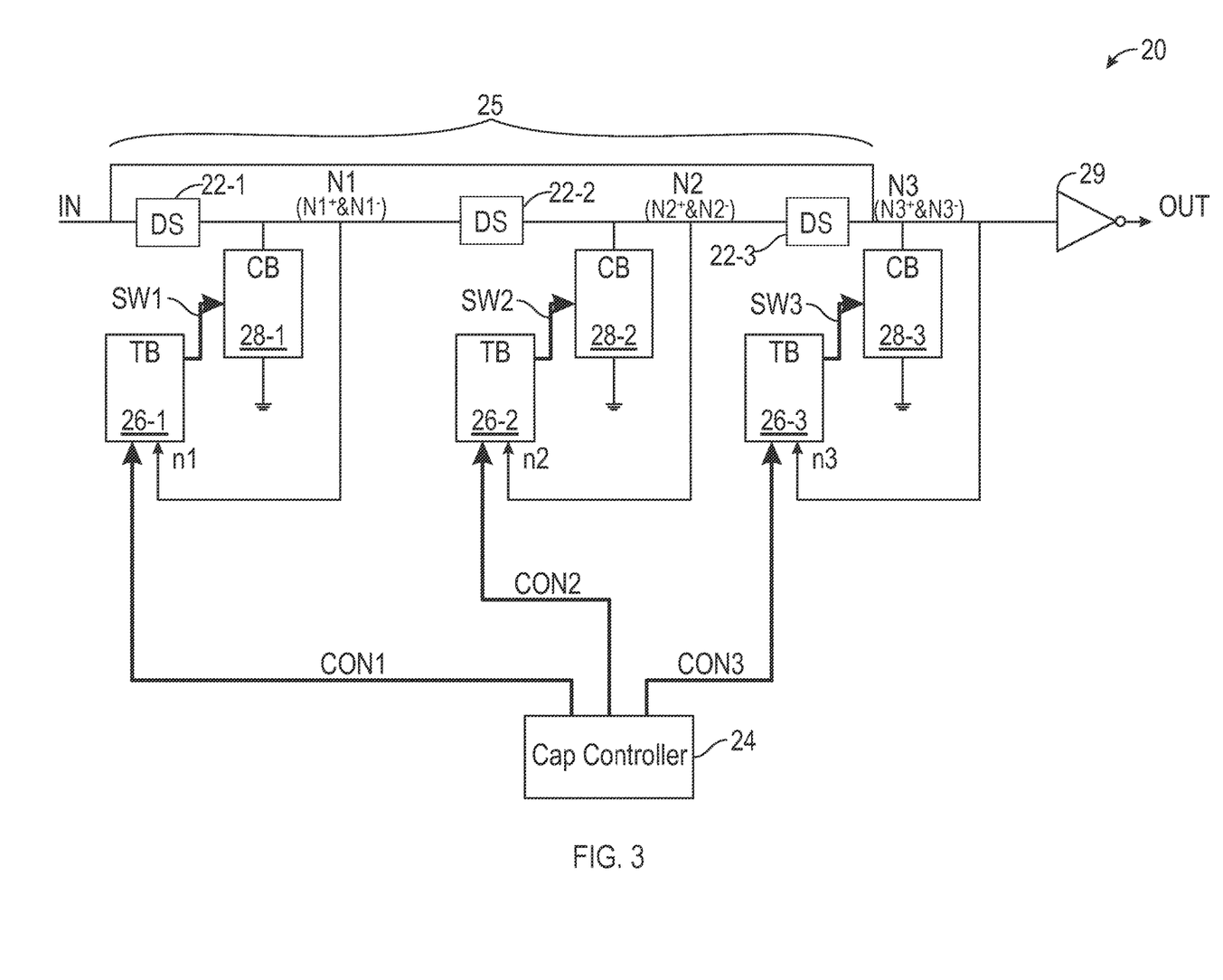
FIG. 3 shows an exemplary ring-oscillator with glitch-free frequency-tuning according to one embodiment of the present disclosure.

FIG. 3 shows an exemplary ring-oscillator 20 with glitch-free frequency-tuning according to one embodiment of the present disclosure. For the purpose of this illustration, the ring-oscillator 20 includes three delay stages (DSs) 22 (e.g., a first delay stage 22-1, a second delay stage 22-2, and a third delay stage 22-3), a cap controller 24, three timing blocks (TBs) 26 (e.g., a first timing block 26-1, a second timing block 26-2, and a third timing block 26-3), three capacitor banks (CBs) 28 (e.g., a first capacitor bank 28-1, a second capacitor bank 28-2, and a third capacitor bank 28-3), and an output inverter 29. In different applications, the ring-oscillator 20 may include more delay stages 22, more or fewer timing blocks 26, more or fewer capacitor banks 28, and more output inverters 29.

Herein, the three delay stages 22 are coupled in series in a ring loop 25, where an input IN of the ring-oscillator 20 is an input of the first delay stage 22-1, an output N1 of the first delay stage 22-1 is coupled to an input of the second delay stage 22-2, an output N2 of the second delay stage 22-2 is coupled to an input of the third delay stage 22-3, and an output N3 of the third delay stage 22-3 is coupled back to the input of the first delay stage 22-1. In addition, an input of the output inverter 29 is coupled to the output N3 of the third delay stage 22-3 and an output of the output inverter 29 is an output OUT of the ring-oscillator 20. In the ring loop 25, there is always a 180-degree phase shift between adjacent delay stages 22, and the ring loop 25 is configured to provide an odd number of 180-degree shifts. As such, there is no stable state in the ring loop 25, and thus, the ring-oscillator 20 can oscillate. In some applications, there might be more than three delay stages 22 included in the ring loop 25, and these delay stages 22 are always coupled in series with an output of the last inverter fed back to an input of the first inverter and also coupled to the input of the output inverter 29. In some applications, the ring-oscillator 20 may include more than one output inverter 29 coupled to the output N1 of the first delay stage 22-1, the output N2 of the second delay stage 22-2, and/or the output N3 of the third delay stage 22-3, and correspondingly may provide more than one outputs (not shown).

In one embodiment, each delay stage 22 may be implemented by a single-end inverter or a differential-circuit inverter, and the 180-degree phase shifts in the ring loop 25 needed for oscillation are achieved by inversions of the inverters. In one embodiment, each delay stage 22 may be implemented by a differential-circuit buffer, and the 180-degree phase shifts in the ring loop 25 needed for oscillation are achieved by interchanging the differential signal from one buffer to the adjacent buffer. Herein, if the delay stages 22 are implemented by differential circuits, the input and output of each delay stage 22 are actually a differential input pair and a differential output pair (e.g., N1=>a pair of $N1^+$ and $N1^-$, N2=>a pair of $N2^+$ and $N2^-$, and N3=>a pair of $N3^+$ and $N3^-$), respectively.

Each capacitor bank 28 is coupled between the output of a corresponding delay stage 22 and ground (e.g., the first capacitor bank 28-1 is coupled between the output N1 of the first delay stage 22-1 and ground, the second capacitor bank 28-2 is coupled between the output N2 of the second delay stage 22-2 and ground, the third capacitor bank 28-3 is coupled between the output N3 of the third delay stage 22-3 and ground). If the delay stages 22 are implemented by differential circuits, for each delay stage 22, two identical capacitor banks 28 (instead of one capacitor bank 28) are coupled between the differential output pair of the corresponding delay stage 22 and ground, respectively (e.g., two identical first capacitor banks 28-1 are coupled between the output pair $N1^+$ and $N1^-$ of the first delay stage 22-1 and ground, respectively; two identical second capacitor banks 28-2 are coupled between the output pair $N2^+$ and $N2^-$ of the second delay stage 22-2 and ground, respectively; two identical third capacitor banks 28-3 are coupled between the output pair $N3^+$ and $N3^-$ of the third delay stage 22-3 and ground, respectively, not shown). As such, the capacitance load is balanced for the differential structure.

In different applications, not every delay stage 22 is followed by the capacitor bank(s) 28. For a non-limited example, the ring-oscillator 20 only includes the third capacitor bank(s) 28-3, while the first capacitor bank(s) 28-1 and the second capacitor bank(s) 28-2 are omitted. For a non-limited example, the ring-oscillator 20 includes the first capacitor bank(s) 28-1 and the third capacitor bank(s) 28-3, while the second capacitor bank(s) 28-2 is omitted.

In detail, the cap controller 24 is configured to determine whether one or more capacitors in each capacitor bank 28 (capacitors are not shown in FIG. 3, see FIGS. 4A-4B) should be connected to or disconnected from the ring loop 25. The one or more first controlling signals CON1 provided by the cap controller 24 determine which capacitor(s) in the first capacitor bank(s) 28-1 should be connected to or disconnected from the output N1 of the first delay stage 22-1. The one or more second controlling signals CON2 provided by the cap controller 24 determine which capacitor(s) in the second capacitor bank(s) 28-2 should be connected to or disconnected from the output N2 of the second delay stage 22-2. The one or more third controlling signals CON3 provided by the cap controller 24 determine which capacitor(s) in the third capacitor bank(s) 28-3 should be connected to or disconnected from the output N3 of the third delay stage 22-3.

Each timing block 26 is configured to determine, once one capacitor in a corresponding capacitor bank 28 is determined to be connected to or disconnected from the ring loop 25 by the cap controller 24, the timing at which such capacitor is connected to or disconnected from the ring loop 25. Each timing block 26 receives the corresponding controlling signal(s) CON from the cap controller 24 and one output signal n of a corresponding delay stage 22 to provide one or more switching signals SW to a corresponding capacitor bank 28 (e.g., the first timing block 26-1 receives the first controlling signal(s) CON1 from the cap controller 24 and the first signal n1 of the first delay stage 22-1 to provide the first switching signal(s) SW1 to the first capacitor bank 28-1, the second timing block 26-2 receives the second controlling signal(s) CON2 from the cap controller 24 and the second signal n2 of the second delay stage 22-2 to provide the second switching signal(s) SW2 to the second capacitor bank 28-2, and the third timing block 26-3 receives the third controlling signal(s) CON3 from the cap controller 24 and the third signal n3 of the third delay stage 22-3 to provide the third switching signal(s) SW3 to the third capacitor bank 28-3). Herein, once the output signal n (e.g., the first signal n1, the second signal n2, or the third signal n3) meets a particular condition (e.g., meets a threshold requirement, at a falling edge of a waveform, or other), the timing block 26 will pass the controlling signal(s) CON from the cap controller 24 to the corresponding capacitor bank 28 as the switching signal(s) SW. Each switching signal SW is a timed controlling signal CON. In other words, the timing at which the capacitor(s) of one capacitor bank 28 is connected to or disconnected from the ring loop 25 is monitoring/synchronized to the local output signal n of the corresponding delay stage 22. As such, each timing block 26 is able to control the timing of connecting or disconnecting the capacitor(s) in the corresponding capacitor bank 28 to the ring loop 25 (e.g., connecting or disconnecting the capacitor(s) when the output signal n of the corresponding loop inverter 22 is at or close to zero volt). This local timing control could lead to a small/negligible change in voltage at the output of the corresponding delay stage 22 (i.e., the change in voltage at the output of the corresponding delay stage 22 is not beyond a threshold, such as not beyond a trigger level of the next inverter) and thus no frequency glitch at the output OUT of the ring-oscillator 20. If one capacitor bank 28 is omitted, a corresponding timing block 26 is not needed.

It is important to note that, with the timing blocks 26, the cap controller 24 has no timing enforce. The cap controller 24 is configured to provide the controlling signals CON that are decoupled with any local or final output signal of the ring-oscillator 20 (e.g., the first output signal n1 of the first delay stage 22-1, the second output signal n2 of the second delay stage 22-2, the third output signal n3 of the third delay stage 22-3, or the output signal of the output inverter 29).

Herein, when the delay stages 22 are implemented by differential circuits, the output signal n of each delay stage 22 is a differential signal pair, and each delay stage 22 is followed by two identical capacitor banks 28. One timing block 26 utilizes either one of the differential output signals of a corresponding delay stage 22 to control when to pass the controlling signal(s) CON to the two identical capacitor banks 28 (e.g., the first timing block 26-1 utilizes one of the differential output signals of the first delay stage 22-1 to control when to pass the first controlling signal(s) CON1 to the two identical first capacitor banks 28-1, the second timing block 26-2 utilizes one of the differential output signals of the second delay stage 22-2 to control when to pass the second controlling signal(s) CON2 to the two identical second capacitor banks 28-2; and the third timing block 26-3 utilizes one of the differential output signals of the third delay stage 22-3 to control when to pass the third controlling signal(s) CON3 to the two identical third capacitor banks 28-3, not shown).

Figure 4A:
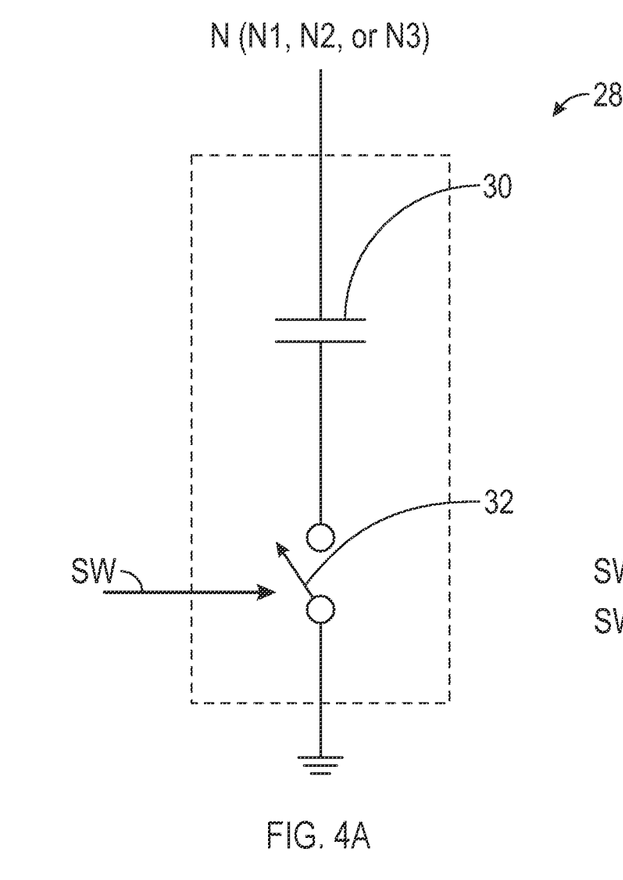
FIGS. 4A-4B show exemplary capacitor banks timing blocks used in the ring-oscillator shown in FIG. 3.
Figure 4B:
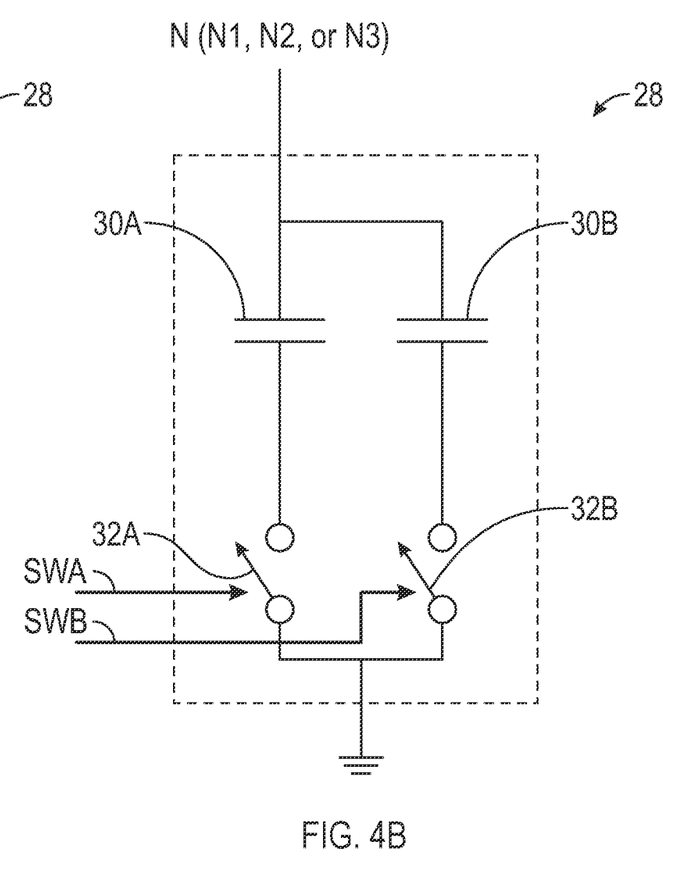
Figure 5A:
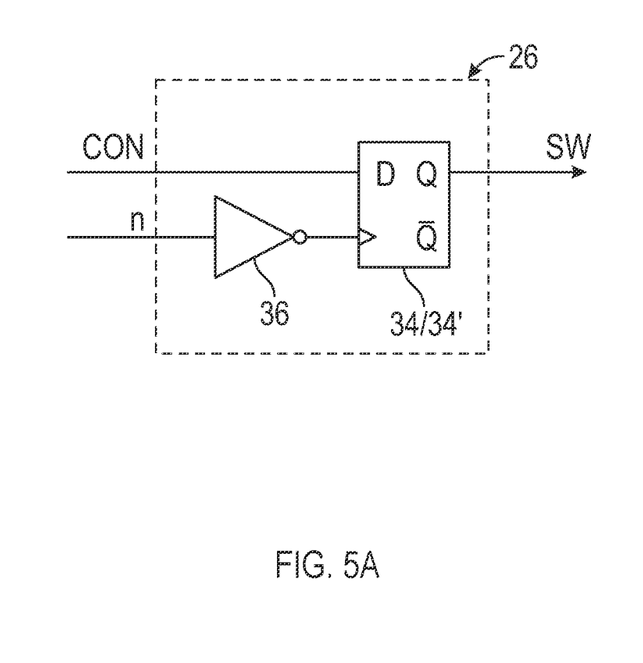
FIGS. 5A-5C show exemplary timing blocks used in the ring-oscillator shown in FIG. 3.
Figure 5B:
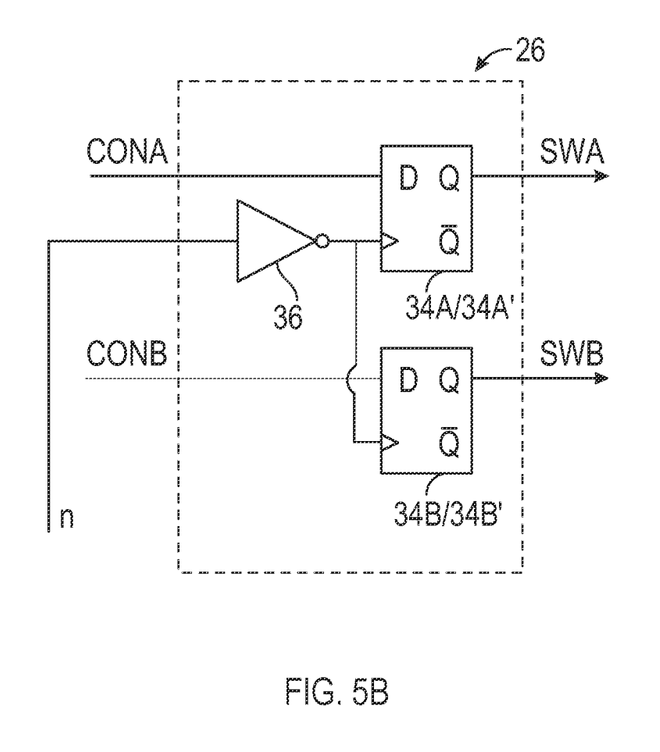
Figure 5C:
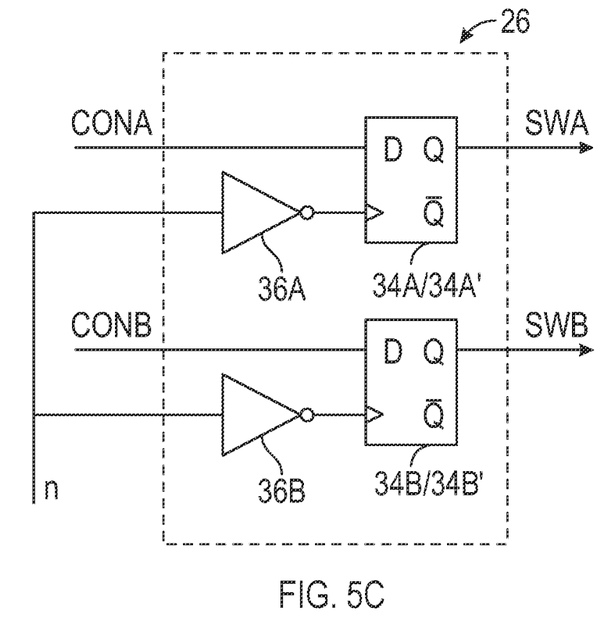

FIGS. 4A-4B show exemplary implementations for one capacitor bank 28 (e.g., one first capacitor bank 28-1, one second capacitor bank 28-2, or one third capacitor bank 28-3), and FIGS. 5A-5C show exemplary implementations for one timing block 26 (e.g., one first timing block 26-1, one second timing block 26-2, or one third timing block 26-3). When the capacitor bank 28 includes only one capacitor 30 and one switch 32 as illustrated in FIG. 4A, the timing block 26 correspondingly includes one D-latch 34 and one block inverter 36 as illustrated in FIG. 5A.

In the capacitor bank 28, the capacitor 30 and the switch 32 are coupled in series between an output N (e.g., N1, N2, or N3) of one delay stage 22 (e.g., the first delay stage 22-1, the second delay stage 22-2, or the third loop converter 22-3, respectively) and ground. Since the capacitor bank 28 includes only one switch 32 to connect or disconnect the capacitor 30, the capacitor bank 28 only needs one switching signal SW to alter the ON/OFF state of the switch 32. In the timing block 26, the D-latch 34 is configured to receive one controlling signal CON (e.g., the first controlling signal CON1, the second controlling signal CON2, or the third controlling signal CON3) from the cap controller 24 at a data input D of the D-latch 34 and an output signal n of one delay stage 22 (e.g., the first output signal n1 of the first delay stage 22-1, the second output signal n2 of the second delay stage 22-2, or the third output signal n3 of the third delay stage 22-3) at a clock input of the D-latch 34 through the block inverter 36, and configured to provide the switching signal SW at an output Q of the D-latch 34 to the switch 32 in the corresponding capacitor bank 28.

In this embodiment, when the output signal n of one delay stage 22 is low (e.g., lower than a threshold value/a trigger level of the block inverter 36, lower than a threshold value/a trigger level of the subsequent delay stage 22, like zero or close to zero), an output of the block inverter 36 is high, which enables the D-latch 34 to pass the received controlling signal CON to the output Q as the switching signal SW. The threshold value/the trigger level of one block inverter 36 and the threshold value/the trigger level of the subsequent delay stage 22 might be the same (e.g., the threshold value/the trigger level of the block inverter 36 in the timing block 26-1 and the threshold value/the trigger level of the second delay stage 22-2 might be the same). The switching signal SW is a timed version of the controlling signal CON. In other words, the controlling signal CON from the cap controller 24 will be scheduled to alter the ON/OFF state of the switch 32 when the output signal n of the delay stage 22 is low. When the output signal n of one delay stage 22 is high (e.g., higher than the threshold value/the trigger level of the block inverter 36, higher than the threshold value/the trigger level of the next delay stage 22), the output of the block inverter 36 is low, which disables the D-latch 34 to pass the received controlling signal CON to the output Q (i.e., latches the received controlling signal CON). Therefore, the ON or OFF state of the switch 32 remains unaltered.

In different applications, the D-latch 34 in the timing block 26 may be replaced by a D-flip-flop 34', which is configured to receive one controlling signal CON (e.g., the first controlling signal CON1, the second controlling signal CON2, or the third controlling signal CON3) from the cap controller 24 at a data input D of the D-flip-flop 34' and the output signal n of one delay stage 22 (e.g., the first output signal n1 of the first delay stage 22-1, the second output signal n2 of the second delay stage 22-2, or the third output signal n3 of the third delay stage 22-3) at a clock input of the D-flip-flop 34' through the block inverter 36, and configured to provide the switching signal SW at an output Q of the D-flip-flop 34' to the switch 32 in the corresponding capacitor bank 28. Herein, when the output signal n of one delay stage 22 is at a falling edge of a waveform, the output of the block inverter 36 provides a rising edge of the waveform, which enables the D-flip-flop 34' to pass the received controlling signal CON to the output Q as the switching signal SW. The controlling signal CON from the cap controller 24 will be scheduled to alter the ON/OFF state of the switch 32 when the output signal n of the delay stage 22 is at the falling edge of the waveform. When the output signal n of one delay stage 22 stays high or is at the rising edge of the waveform, the D-flip-flop 34' will not pass the received controlling signal CON to the output Q (i.e., hold the received controlling signal CON). Therefore, the ON or OFF state of the switch 32 remains unaltered.

Furthermore, in some applications, one capacitor bank 28 may include two or more capacitors 30 (e.g., an AA capacitor 30A and a BB capacitor 30B) and two or more corresponding switches 32 (e.g., an AA switch 32A and a BB switch 32B, respectively), as illustrated in FIG. 4B. The AA capacitor 30A is parallel with the BB capacitor 30B, each of which is coupled between the output N (e.g., N1, N2, or N3) of one delay stage 22 (e.g., the first delay stage 22-1, the second delay stage 22-2, or the third loop converter 22-3, respectively) and ground via the corresponding switch 32. The capacitors 30 may be integrated capacitors, which match very well and make monotonic frequency tuning possible in a small die area. The switches 32 may be metal-oxide-semiconductor field-effect transistor (MOSFET) switches. When the capacitor 30 is conducting, the capacitor 32 is coupled to the ground, not a mid-rail voltage, yielding a good ON-OFF ratio of the MOSFET switch 32.

For the purpose of this illustration, the capacitor bank 28 includes two switches 32 to connect or disconnect the capacitors 30, the capacitor bank 28 needs two switching signals SW (e.g., an AA switching signal SWA and a BB switching signal SWB) to alter the ON/OFF states of the two switches 32 (e.g., the AA switching signal SWA controls the AA switch 32A and the BB switching signal SWB controls the BB switch 32B). The AA switching signal SWA and the BB switching signal SWB might be the first switching signals SW1 provided by the first timing block 26-1, or the second switching signals SW2 provided by the second timing block 26-2, or the third switching signals SW3 provided by the third timing block 26-3.

When the capacitor bank 28 includes two or more capacitors 30, the timing block 26 correspondingly includes two or more D-latches 34 (e.g., an AA D-latch 34A and a BB D-latch 34B) as illustrated in FIG. 5B. In the timing block 26, the AA D-latch 34A is configured to receive an AA controlling signal CONA at a data input of the AA D-latch 34A and the output signal n of the corresponding delay stage 22 (e.g., the first output signal n1 of the first delay stage 22-1, the second output signal n2 of the second delay stage 22-2, or the third output signal n3 of the third delay stage 22-3) at a clock input of the AA D-latch 34A through the block inverter 36, and configured to provide the AA switching signal SWA at an output Q of the AA D-latch 34A to the AA switch 32A in the corresponding capacitor bank 28. The BB D-latch 34B is configured to receive a BB controlling signal CONB at a data input of the BB D-latch 34B and the output signal n of the corresponding delay stage 22 at a clock input of the BB D-latch 34B through the block inverter 36, and configured to provide the BB switching signal SWB at an output Q of the BB D-latch 34B to the BB switch 32B in the corresponding capacitor bank 28. Herein, the AA controlling signal CONA and the BB controlling signal CONB might be the first controlling signals CON1, or the second controlling signals CON2, or the third controlling signals CON3 provided by the cap controller 24.

In this embodiment, when the output signal n of one delay stage 22 is low (e.g., lower than a threshold value/a trigger level of the block inverter 36, lower than a threshold value/a trigger level of the next delay stage 22, like zero or close to zero), an output of the block inverter 36 is high, which enables the AA D-latch 34A to pass the received AA controlling signal CONA to the output Q of the AA D-latch 34A as the AA switching signal SWA and enables the BB D-latch 34B to pass the received BB controlling signal CONB to the output Q of the BB D-latch 34B as the BB switching signal SWB. The AA switching signal SWA is a timed version of the AA controlling signal CONA, and the BB switching signal SWB is a timed version of the BB controlling signal CONB. If the controlling signals CONA and CONB are separate signals, the switching signals SWA and SWB are separate signals as well. Herein, when the output signal n of the delay stage 22 is low, the controlling signals CONA and CONB from the cap controller 24 will be scheduled to alter the ON/OFF states of the switches 32A and 32B, respectively. In addition, when the output signal n of one delay stage 22 is high (e.g., higher than the threshold value/the trigger level of the block inverter 36, higher than the threshold value/the trigger level of the next delay stage 22), the output of the block inverter 36 is low, which disables the D-latches 34A and 34B to pass through the received controlling signals CONA and CONB, respectively. Therefore, the ON or OFF states of the switches 32A and 32B remain unaltered.

Similar to what is described above, in different applications, the D-latches 34A and 34B in the timing block 26 may be replaced by D-flip-flops 34A' and 34B'. When the output signal n of one delay stage 22 is at the falling edge of a waveform, the AA D-flip-flop 34A' can pass the received AA controlling signal CONA to the output Q of the AA D-flipflop 34A' as the AA switching signal SWA so as to alter the ON/OFF states of the switch 32A, and the BB D-flip-flop 34B' can pass the received BB controlling signal CONB to the output Q of the BB D-flip-flop 34B' as the BB switching signal SWB so as to alter the ON/OFF state of the switch 32B.

In FIG. 5B, the AA D-latch 34A and the BB D-latch 34B (or the AA D-flip-flop 34A' and the BB D-flip-flop 34B') share a same block inverter 36 to get the inverted version of the output signal n of the delay stage 22. In some applications, each of the AA D-latch 34A (the AA D-flip-flop 34A') and the BB D-latch 34B (the BB D-flip-flop 34B') may have its own block inverter 36 (e.g., an AA block inverter 36A and a BB block inverter 36B) as illustrated in FIG. 5C. The output signal n of the delay stage 22 is fed to the input of each of the AA block inverter 36A and the BB block inverter 36B.

Notice that each capacitor 30/switch 32 in one capacitor bank 28 corresponds to one specific D-latch 34 (one specific D-flip-flop 34') in the timing block 26. As such, the capacitors 30 included in a same capacitor bank 28 can be individually connected to or disconnected from the ring loop 25. In addition, the capacitors 30 followed by different delay stages 22 can be individually connected to or disconnected from the ring loop 25 (e.g., one capacitor 30 in the first capacitor bank 28-1 and one capacitor 30 in the second capacitor bank 28-2 can be controlled individually). Each timing block 26 is monitoring/synchronizing to the local output signal n of the corresponding delay stage 22 (e.g., the first timing block 26-1 is monitoring/synchronizing to the local output signal n1 of the first delay stage 22-1, the second timing block 26-2 is monitoring/synchronizing to the local output signal n2 of the second delay stage 22-2, and the third timing block 26-3 is monitoring/synchronizing to the local output signal n3 of the third delay stage 22-3). Different timing blocks 26 are monitoring/synchronizing different local output signals n. Therefore, the switching signals SW provided by different timing blocks 26 are still asynchronous.

In different applications, the capacitor bank 28 and the timing block 26 following different delay stages 22 may have different configurations. For a non-limited example, the first capacitor bank 28-1 and the first timing block 26-1 following the first delay stage 22-1 may be implemented as shown in FIGS. 4A and 5A, respectively; the second capacitor bank 28-2 and the second timing block 26-2 following the second delay stage 22-2 may be implemented as shown in FIGS. 4A and 5A, respectively; and the third capacitor bank 28-3 and the third timing block 26-3 following the third delay stage 22-3 may be implemented as shown in FIGS. 4B and 5B, respectively.

Besides avoiding glitches during tuning frequency, the ring-oscillator 20 benefits additional advantages. The asynchronous switching signals SW provided by different timing blocks 26 will yield a low-power consumption of the ring-oscillator 20 compared to a ring-oscillator with globally synchronized switching signals SW. For the ring-oscillator 20, when an update (i.e., connecting or disconnecting) moment is just missed, it will occur on the next clock cycle, which is for PLLs and many other applications a low enough delay (e.g., 5 ns max delay). In addition, connecting or disconnecting the capacitor(s) 30 does not disturb a power supply of the delay stages 22.

Figure 6A:
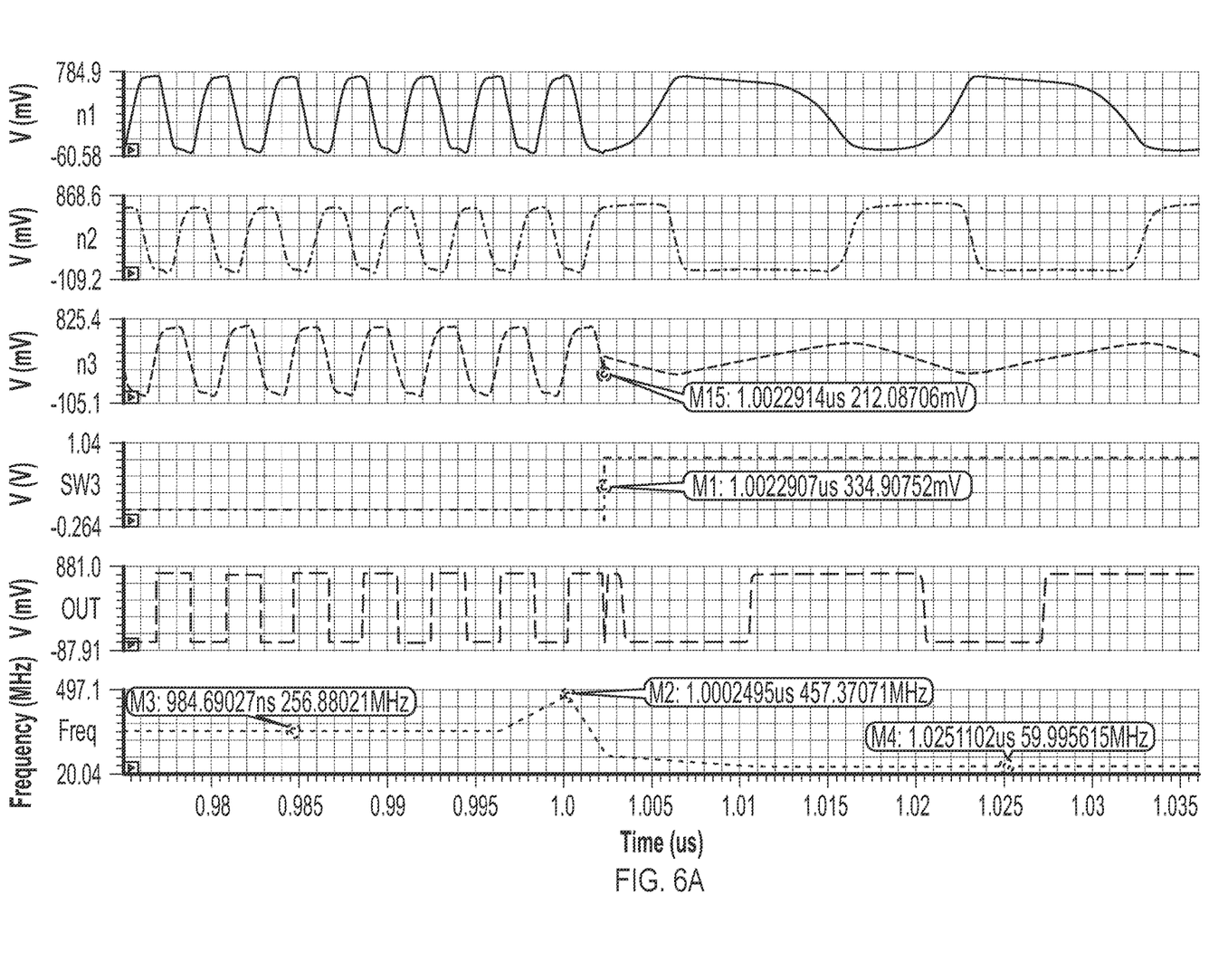
FIGS. 6A-6B show simulation comparisons.
Figure 6B:
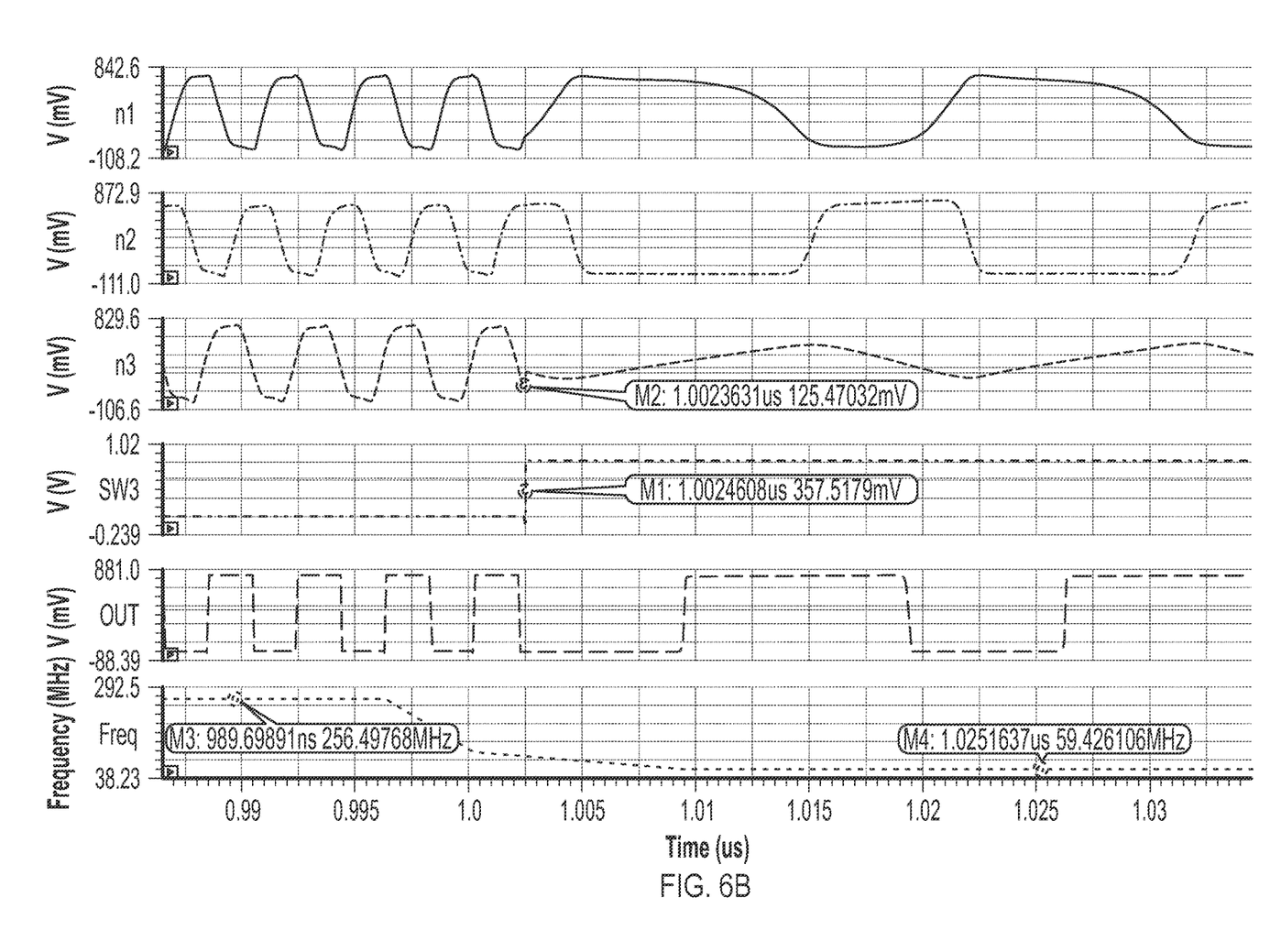

FIGS. 6A and 6B show simulation comparisons of frequency tuning between ring-oscillators with configurations shown in FIGS. 2 and 3, respectively. Herein, the intent is to change the oscillating frequency from 256.88 MHz to 59.995 MHz. The frequency tuning is achieved by altering capacitance loading at the output of the third delay stage 12-3 or 22-3 in the ring-oscillator 10 or 20, respectively.

FIG. 6A shows simulation waveforms of frequency tuning for the conventional asynchronous ring-oscillator 10. The switching signal SW3, which controls the capacitance loading connected to the output N3 of the third delay stage 12-3, changes from low to high when the output signal n3 at the output N3 of the third delay stage 12-3 is not close to zero. Charge redistribution occurs at the output N3 of the third delay stage 12-3, which momentarily pulls the output signal n3 of the third delay stage 12-3 to a value below the inverting threshold of the output inverter 19. Consequently, the output inverter 19 switches to high and a high frequency glitch is generated at the output OUT of the ring-oscillator 10.

FIG. 6B shows simulation waveforms of frequency tuning for the proposed asynchronous ring-oscillator 20, which has local timing (e.g., based on the output signal of a local corresponding delay stage 22) for connecting or disconnecting each capacitor in the capacitor banks. The switching signal SW3, which controls the capacitance loading connected to the output N3 of the third delay stage 22-3, changes from low to high only when the output signal n3 at the output N3 of the third delay stage 22-3 is close to zero. It is because the third timing block 26-3 provides timing control of the switching signal SW3 based on the output signal n3 of the third delay stage 22-3. Therefore, the voltage change at the output N3 of the third delay stage 22-3, due to small/negligible charge redistribution, is not sufficient to change the state of the output inverter 29. Consequently, high frequency glitch is avoided at the output OUT of the ring-oscillator 20.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A ring-oscillator comprising:
 a plurality of delay stages coupled in series within a ring loop, wherein the plurality of delay stages includes a first delay stage and a second delay stage, which is a subsequent delay stage of the first delay stage, and coupled between the first delay stage and an output of the ring-oscillator;
 a first capacitor bank coupled between an output of the first delay stage and ground; and
 a first timing block configured to receive an output signal of the first delay stage and at least one first controlling signal, wherein:
  the output signal of the first delay stage is not an output signal of the ring-oscillator;
  the at least one first controlling signal determines at least one first capacitor in the first capacitor bank connecting or disconnecting to the ring loop; and
  when the output signal of the first delay stage meets a first certain condition, the first timing block is configured to pass the at least one first controlling signal to the first capacitor bank as at least one first switching signal, and when the output signal of the first delay stage does not meet the first certain condition, the first timing block is configured to disable passing the at least one first controlling signal to the first capacitor bank, such that the connection or disconnection of the at least one first capacitor does not cause a voltage at the output of the first delay stage to change beyond a first threshold being a trigger level of the second delay stage.

2. The ring-oscillator of claim 1 wherein:
the first capacitor bank includes the at least one first capacitor and at least one first switch;
the at least one first capacitor and the at least one first switch are coupled in series between the output of the first delay stage and ground; and
the at least one first switch is controlled by the at least one first switching signal.

3. The ring-oscillator of claim 2 wherein the at least one first switch is a metal-oxide-semiconductor field-effect transistor (MOSFET) switch.

4. The ring-oscillator of claim 2 wherein:
the first timing block includes at least one first D-latch and at least one first block inverter, wherein the first threshold is also a trigger level of the at least one first block inverter; and
the at least one first D-latch is configured to receive the at least one first controlling signal at a data input of the at least one first D-latch and to receive the output signal of the first delay stage at a clock input of the at least one first D-latch through the at least one first block inverter, and configured to provide the at least one first switching signal to the at least one first switch in the first capacitor bank, wherein:
when the output signal of the first delay stage is lower than the first threshold, the at least one first D-latch passes the at least one first controlling signal to the at least one first switch in the first capacitor bank as at least one first switching signal; and
when the output signal of the first delay stage is higher than the first threshold, at least one first D-latch holds the at least one first controlling signal.

5. The ring-oscillator of claim 1 wherein:
the first capacitor bank includes a plurality of first capacitors and a plurality of first switches, wherein the at least one first capacitor is included in the plurality of first capacitors;
each of the plurality of first capacitors and a corresponding one of the plurality of first switches are coupled in series between the output of the first delay stage and ground; and
the at least one first switching signal includes a plurality of first switching signals, and each of the plurality of first switches is controlled by a corresponding one of the plurality of first switching signals.

6. The ring-oscillator of claim 5 wherein:
the first timing block includes a plurality of first D-latches and a first block inverter, wherein the first threshold is also a trigger level of the first block inverter;
the at least one first controlling signal includes a plurality of first controlling signals; and
each of the plurality of first D-latches is configured to receive a corresponding one of the plurality of first controlling signals at a data input and to receive the output signal of the first delay stage at a clock input through the first block inverter, and configured to provide the corresponding one of the plurality of first switching signals to the corresponding one of the plurality of first switches in the first capacitor bank, wherein:
when the output signal of the first delay stage is lower than the first threshold, each of the plurality of first D-latches passes the corresponding one of the plurality of first controlling signals to the corresponding switch of the plurality of first switches in the first capacitor bank as the corresponding one of the plurality of first switching signals; and
when the output signal of the first delay stage is higher than the first threshold, each of the plurality of first D-latches holds the corresponding one of the plurality of first controlling signals.

7. The ring-oscillator of claim 1 further comprising a second capacitor bank and a second timing block, wherein:
the second capacitor bank is coupled between an output of the second delay stage and ground; and
the second timing block is configured to receive an output signal of the second delay stage and at least one second controlling signal, wherein:
the at least one second controlling signal determines at least one second capacitor in the second capacitor bank connecting or disconnecting to the ring loop; and
when the output signal of the second delay stage meets a second certain condition, the second timing block is configured to pass the at least one second controlling signal to the second capacitor bank, and when the output signal of the second delay stage does not meet the second certain condition, the second timing block is configured to disable passing the at least one second controlling signal to the second capacitor bank, such that the connection or disconnection of the at least one second capacitor in the second capacitor bank does not cause a voltage at the output of the second delay stage to change beyond a second threshold being a trigger level of a subsequent delay stage of the second delay stage.

8. The ring-oscillator of claim 7 wherein:
the first capacitor bank includes the at least one first capacitor and at least one first switch;
the at least one first capacitor and the at least one first switch are coupled in series between the output of the first delay stage and ground;
the at least one first switch is controlled by the at least one first switching signal;
the second capacitor bank includes the at least one second capacitor and at least one second switch;
the at least one second capacitor and the at least one second switch are coupled in series between the output of the second delay stage and ground; and
the at least one second switch is controlled by the at least one second switching signal.

9. The ring-oscillator of claim 8 wherein the first capacitor bank and the second capacitor bank have different numbers of capacitors and different numbers of switches.

10. The ring-oscillator of claim 8 wherein the first capacitor bank and the second capacitor bank have a same number of capacitors and a same number of switches.

11. The ring-oscillator of claim 8 wherein:
the first timing block includes at least one first D-latch and at least one first block inverter, wherein the first threshold is also a trigger level of the at least one first block inverter;
the at least one first D-latch is configured to receive the at least one first controlling signal at a data input of the at least one first D-latch and to receive the output signal of the first delay stage at a clock input of the at least one first D-latch through the at least one first block inverter, and configured to provide the at least one first switching signal to the at least one first switch in the first capacitor bank, wherein:
  when the output signal of the first delay stage is lower than the first threshold, the at least one first D-latch passes the at least one first controlling signal to the at least one first switch in the first capacitor bank as at least one first switching signal; and
  when the output signal of the first delay stage is higher than the first threshold, at least one first D-latch holds the at least one first controlling signal;
the second timing block includes at least one second D-latch and at least one second block inverter, wherein the second threshold is also a trigger level of the at least one second block inverter; and
the at least one second D-latch is configured to receive the at least one second controlling signal at a data input of the at least one second D-latch and to receive the output signal of the second delay stage at a clock input of the at least one second D-latch through the at least one second block inverter, and configured to provide the at least one second switching signal to the at least one second switch in the second capacitor bank, wherein:
  when the output signal of the second delay stage is lower than the second threshold, the at least one second D-latch passes the at least one second controlling signal to the at least one second switch in the second capacitor bank as at least one second switching signal; and
  when the output signal of the second delay stage is higher than the second threshold, at least one second D-latch holds the at least one second controlling signal.

12. The ring-oscillator of claim 11 wherein:
the first capacitor bank and the second capacitor bank have different numbers of capacitors and different numbers of switches; and
the first timing block and the second timing block have different numbers of D-latches.

13. The ring-oscillator of claim 11 wherein:
the first capacitor bank and the second capacitor bank have a same number of capacitors and a same number of switches; and
the first timing block and the second timing block have a same number of D-latches.

14. The ring-oscillator of claim 1 further comprising a plurality of capacitor banks and a plurality of timing blocks, wherein:
the first capacitor bank is included in the plurality of capacitor banks, and the first timing block is included in the plurality of timing blocks;
each of the plurality of capacitor banks is coupled between an output of a corresponding one of the plurality of delay stages and ground; and
each of the plurality of timing blocks is configured to provide at least one switching signal to a corresponding one of the plurality of capacitor banks based on an output signal of the corresponding one of the plurality of delay stages.

15. The ring-oscillator of claim 14 wherein each of the plurality of delay stages is followed by a corresponding one of the plurality of capacitor banks.

16. The ring-oscillator of claim 2 wherein:
the first timing block includes at least one first D-flip-flop and at least one first block inverter; and
the at least one first D-flip-flop is configured to receive the at least one first controlling signal at a data input of the at least one first D-flip-flop and to receive the output signal of the first delay stage at a clock input of the at least one first D-flip-flop through the at least one first block inverter, and configured to provide the at least one first switching signal to the at least one first switch in the first capacitor bank, wherein:
  when the output signal of the first delay stage is at a falling edge of a signal waveform, the at least one first D-flip-flop passes the at least one first controlling signal to the at least one first switch in the first capacitor bank as at least one first switching signal; and
  when the output signal of the first delay stage is not at the falling edge of the signal waveform, the at least one first D-flip-flop holds the at least one first controlling signal.

17. The ring-oscillator of claim 1 wherein the first certain condition is that the output signal of the first delay stage is lower than the first threshold.

18. The ring-oscillator of claim 17 wherein the first threshold is a trigger level of a delay stage of the plurality of delay stages that follows the first delay stage.

19. The ring-oscillator of claim 1 wherein the first certain condition is that the output signal of the first delay stage is at a falling edge of a waveform.

20. The ring-oscillator of claim 1 wherein each of the plurality of delay stages is be implemented by a differential-circuit inverter, and 180-degree phase shifts in the ring loop needed for oscillation are achieved by inversions of the differential-circuit inverter.

21. The ring-oscillator of claim 1 wherein each of the plurality of delay stages is be implemented by a differential-circuit buffer, and 180-degree phase shifts in the ring loop needed for oscillation are achieved by interchanging differential signal from one differential-circuit buffer to an adjacent differential-circuit buffer.

22. The ring-oscillator of claim 1 further comprising a cap controller, which is configured to provide the at least one first controlling signal, wherein the at least one first controlling signal is decoupled with any output signal at an output of each delay stage of the plurality of delay stages.

* * * * *